(12) United States Patent
Cheng et al.

(10) Patent No.: US 8,673,735 B2
(45) Date of Patent: Mar. 18, 2014

(54) SEMICONDUCTOR DEVICE AND METHOD FOR MAKING SAME

(75) Inventors: Kangguo Cheng, Yorktown Heights, NY (US); Bruce B. Doris, Brewster, NY (US); Tenko Yamashita, Schenectady, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/617,464

(22) Filed: Sep. 14, 2012

(65) Prior Publication Data
US 2013/0017667 A1 Jan. 17, 2013

Related U.S. Application Data

(63) Continuation of application No. 13/083,879, filed on Apr. 11, 2011.

(51) Int. Cl.
*H01L 21/76* (2006.01)

(52) U.S. Cl.
USPC ...... 438/424; 438/435; 438/296; 257/E21.54; 257/499

(58) Field of Classification Search
USPC ......... 438/424–426, 702, 435, 437, 296, 405; 257/E21.546, 499, E21.54
See application file for complete search history.

(56) References Cited

U.S. PATENT DOCUMENTS

| | | | |
|---|---|---|---|
| 2004/0242010 A1* | 12/2004 | Deshpande et al. | 438/710 |
| 2005/0051867 A1* | 3/2005 | Lee et al. | 257/510 |
| 2006/0040462 A1* | 2/2006 | Wu et al. | 438/424 |
| 2007/0026629 A1 | 2/2007 | Chen et al. | |
| 2007/0293045 A1* | 12/2007 | Youn et al. | 438/689 |
| 2008/0001249 A1* | 1/2008 | Sheen et al. | 257/499 |
| 2008/0160718 A1 | 7/2008 | Lee et al. | |
| 2010/0052094 A1* | 3/2010 | Carter et al. | 257/510 |

* cited by examiner

*Primary Examiner* — Wael Fahmy
*Assistant Examiner* — Sarah Salerno
(74) *Attorney, Agent, or Firm* — Novak Druce Connolly Bove + Quigg LLP; Louis J. Percello, Esq.

(57) ABSTRACT

A semiconductor device includes a substrate having at least one nitride material lined isolation cavity; and a hafnium containing dielectric fill at least partially contained in and at least partially covering at least a portion of the at least one nitride lined isolation cavity.

16 Claims, 7 Drawing Sheets

SEMICONDUCTOR DEVICE AND METHOD FOR MAKING SAME

BACKGROUND OF THE INVENTION

1. Priority

Priority is claimed as a continuation application to U.S. patent application Ser. No. 13/083,879, filed Apr. 11, 2011, the disclosure of which is incorporated herein by reference.

2. Field of the Invention

The field of the present invention relates to semiconductor devices and manufacture methods, and more specifically, to limiting regrowth and threshold voltage (Vt) shift in such devices.

3. Background

Limiting regrowth and threshold voltage (Vt) shift has proven to be significant hurdle in gate first, metal gate, high k field effect transistor (FET) production, particularly where $HfO_2$ gate dielectrics are used.

HfSiON may be used to reduce deleterious effects associated with regrowth and Vt shift. However, the scalability of conventional HfSiON based processing techniques, relative to $HfO_2$-based processing techniques for example, is limited. For example, a thinner inversion thickness (Tinv) can be achieved using $HfO_2$, but regrowth and Vt shift occurrence is more prevalent relative to HfSiON.

SUMMARY OF THE INVENTION

According to certain embodiments of the present invention, a semiconductor device including a substrate having at least one nitride material lined isolation cavity; and a hafnium containing dielectric fill at least partially contained in and at least partially covering at least a portion of the at least one nitride lined isolation cavity.

According to certain embodiments of the present invention, a method comprising: providing a substrate having at least one open-ended cavity; nitride lining the cavity; at least partially filling the lined cavity with a hafnium containing dielectric; and, forming device layers on the substrate; wherein the cavity at least partially isolates at least two semiconductor devices incorporating to the formed device layers.

According to certain embodiments of the present invention, a method including: providing a substrate supporting an oxide pad, the oxide pad supporting a nitride pad; patterning the substrate, oxide and nitride pads to provide at least one open-ended cavity through the oxide and nitride pads and in the substrate; forming a nitride liner substantially around the cavity in the substrate; forming a hafnium containing bulk dielectric at least partially contained in the cavity and covering at least a portion of the nitride liner; and forming device layers on the at least partially nitride lined, at least partially dielectric filled cavity containing substrate; wherein the cavity at least partially isolates at least two semiconductor devices corresponding to the formed device layers.

BRIEF DESCRIPTION OF THE DRAWINGS

In the drawings, wherein like reference numerals refer to similar components.

DETAILED DESCRIPTION OF THE PREFERRED EMBODIMENT

A shallow trench isolation (STI) feature may be filled with $SiO_2$ using SA-CVD or HDP processing techniques. However, it is believed that oxygen diffusion from the $SiO_2$ is a main source of regrowth and Vt shift. In certain embodiments of the present invention, regrowth and Vt shift effects may be mitigated via STI fill processing, such as by incorporating HfSiON into an STI trench fill.

Figure 1:
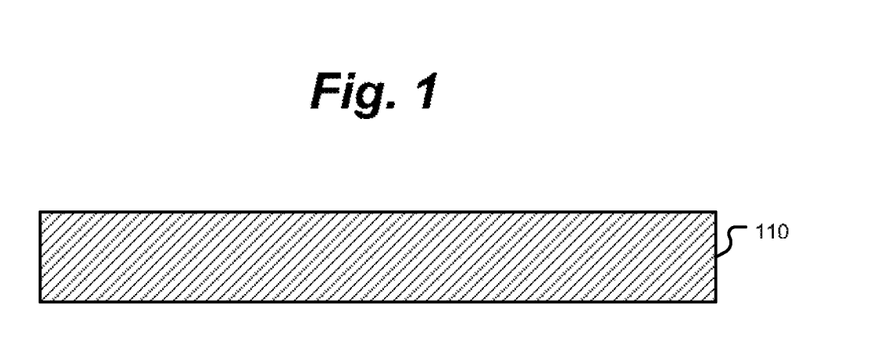
FIG. 1 illustrates a schematic view of a substrate that may be processed to form a semiconductor-type electronic device.

Referring now to FIG. 1, there is shown a schematic view of a substrate 110 that may be used according to certain embodiments of the present invention. Substrate 110 may take the form of any suitable substrate for semiconductor-device formation. Substrate 110 may take the form of any suitable substrate for transistor formation. Substrate 110 may take the form of any suitable substrate for field effect transistor (FET) formation. Substrate 110 may take the form of any suitable substrate for gate first, metal gate, high k field effect transistor (FET) formation.

For example, substrate 110 may take the form of a semiconductor substrate, such as a conventional bulk silicon substrate. By way of further example, substrate 110 may take the form of a conventional silicon-on-insulator (SOI) type substrate. An SOI substrate, as used herein, generally refers to a buried-insulator or layered silicon-insulator-silicon-type substrate. Such a configuration may, in certain circumstances, tend to reduce parasitic device capacitance and thereby improving performance relative to conventional bulk-semiconductor-type substrates, for example.

In certain embodiments of the present invention, substrate 110 may be processed to provide a semiconductor device 100, such as a gate first, metal gate, high k field effect transistor (FET).

Figure 2:
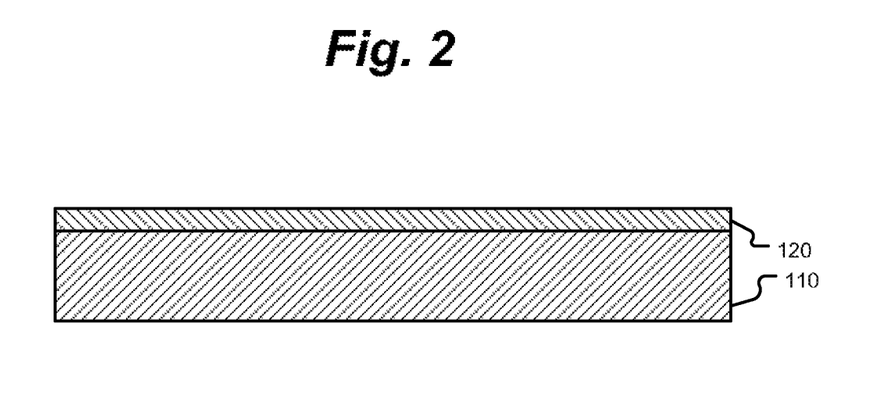
FIGS. 2-15 illustrate schematic views of the substrate of FIG. 1 at various processing stages.

Referring now also to FIG. 2, there is shown an embodiment of a processed substrate 110 according to certain embodiments of the present invention. In the illustrated case, an oxide pad 102 has been provided. In certain embodiments of the present invention, pad 120 may take the form of a $SiO_2$ pad, for example. Such a $SiO_2$ pad may, in certain embodiments of the present invention, be characterized as being about 25-200 angstrom thick, such as about 50 angstrom thick.

Such an $SiO_2$ pad may be formed, in certain embodiments of the present invention, by thermally oxidizing at least a portion of substrate 110, such as by using a furnace bake incorporating process, for example.

Figure 3:
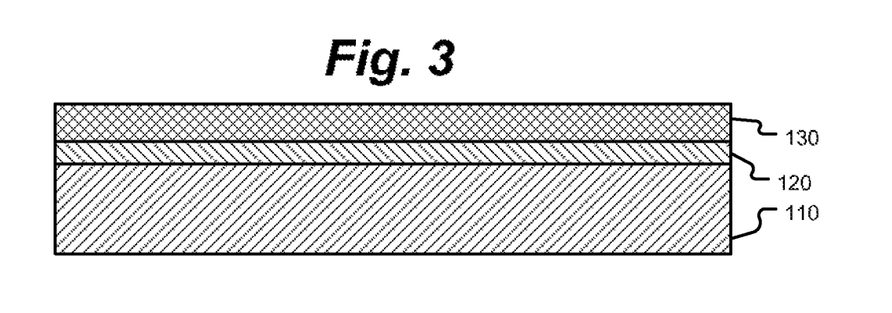

Referring now also to FIG. 3, there is shown an embodiment of a processed substrate 110 according to certain embodiments of the present invention. In the illustrated case, a nitride pad 130 has been provided. In certain embodiments of the present invention, pad 130 may take the form of a SiN pad, for example. Such a SiN pad may, in certain embodiments of the present invention, be characterized as about 400 to 1000 angstroms thick, such as about 500 angstroms thick, for example.

Such a SiN pad may be formed on or over pad 120 using low pressure chemical vapor deposition (LP-CVD) or Rapid Thermal Chemical Vapor Deposition (RT-CVD) techniques, for example.

Figure 4:
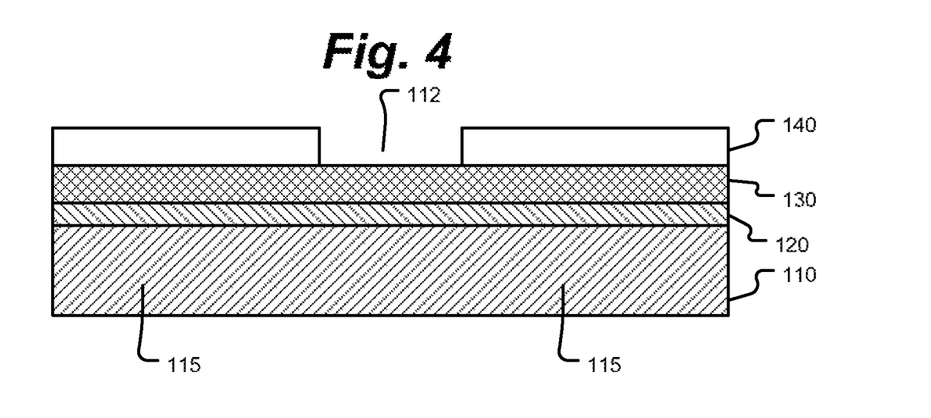

Referring now also to FIG. 4, there is shown an embodiment of a processed substrate 110 according to certain embodiments of the present invention. In the illustrated case, an etch-protective layer 140 has been provided. In certain embodiments of the present invention, layer 140 may take the form of a resist material, such as a photoresist material patterned to provide at least one opening 145. In certain embodiments of the present invention, a portion of nitride pad 130 is exposed by opening 145. In certain embodiments of the present invention, the exposed portion(s) of nitride pad 130 may correspond to an isolation region between active region(s) of semiconductor devices based upon substrate 110, such as FETs for example. Such a resist layer may, in certain embodiments of the present invention, be characterized as being conventional state of the art photoresist material suitable for a 193 nm photolithography processing.

Etch masking layer 140 may be provided on or over layer 130 using conventional coating and masking techniques suitable for use with the selected materials, for example.

Figure 5:
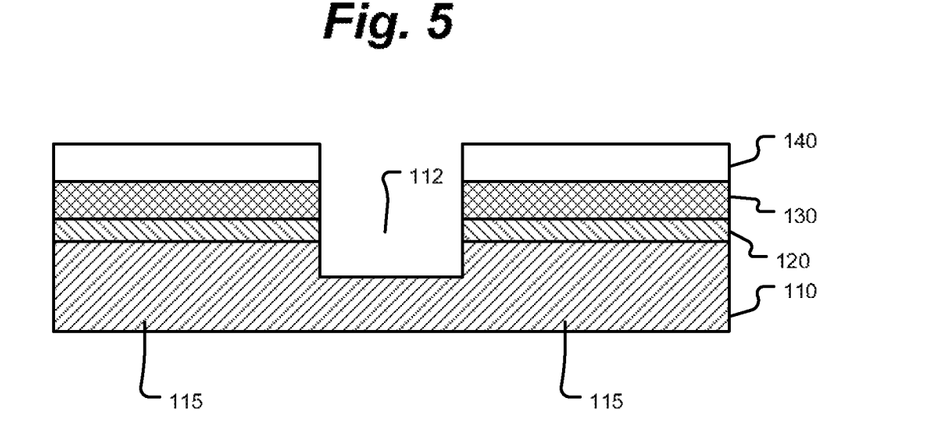

Referring now also to FIG. 5, there is shown an embodiment of a processed substrate 110 according to certain embodiments of the present invention. In the illustrated case, etch-protective layer 140 has been used as an etch mask to provide for a shallow trench isolation (STI) feature 112 based upon opening 145 and that extends through nitride pad 130, oxide pad 120 and into substrate 110. STI feature 112 may, in certain embodiments of the present invention, extend sufficiently deep through pads 120/130 and into a buried insulator layer of an SOI-type substrate 110 and/or into a bulk silicon substrate 110 to provide effective isolation to active device regions 115 at least substantially adjacent STI feature 112.

Suitable processing to form STI feature 112 may, in certain embodiments of the present invention, be characterized as including 193 nm photolithography material compatible etching techniques, such as dry plasma etching techniques, for example.

Figure 6:
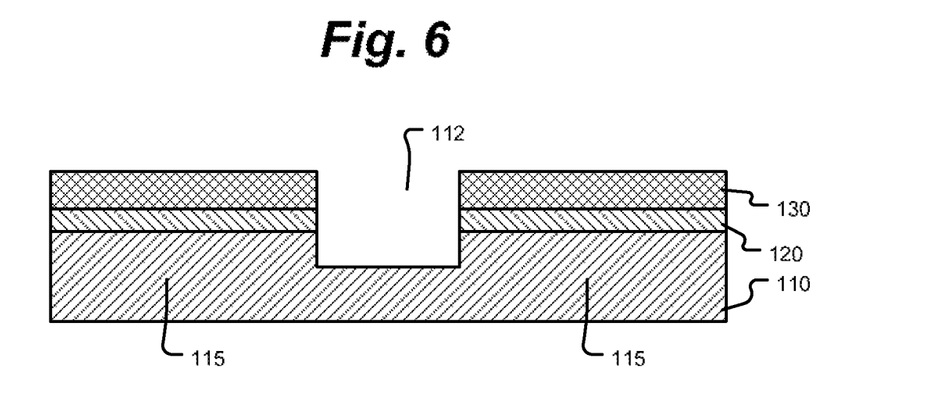

Referring now also to FIG. 6, there is shown an embodiment of a processed substrate 110 according to certain embodiments of the present invention. In the illustrated case, etch-protective layer 140 has been removed.

In certain embodiments of the present invention, layer 140 may be removed using an ashing technique. For example, a dry plasma $O_2$ ash chemistry-based process may be used to at least partially remove layer 140. In certain embodiments of the present invention, rinsing may also be used. For example, a wet rinse using sulfuric peroxide, SC1($NH_4OH:H_2O_2:H_2O$), and/or SC2 ($H_2O:H_2O_2:HCl$) solutions may be used as part of removing layer 140. In certain embodiments of the present invention, such an ashing may be followed by such a rinsing process.

Figure 7:
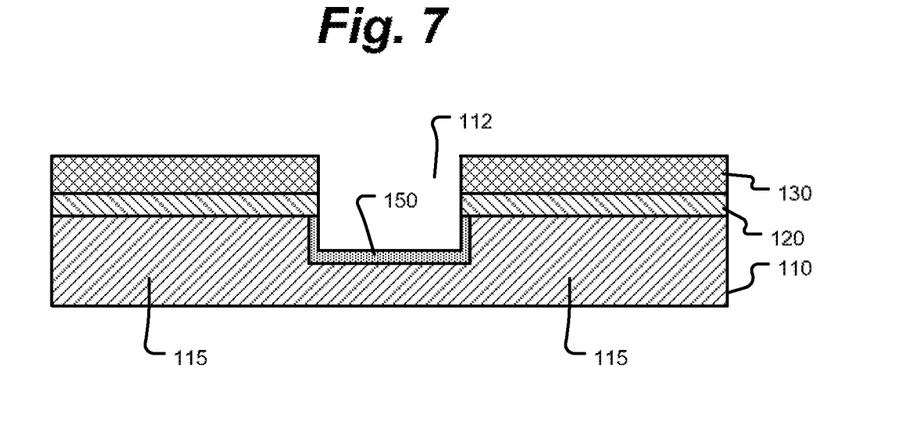

Referring now also to FIG. 7, there is shown an embodiment of a processed substrate 110 according to certain embodiments of the present invention. In the illustrated case, a liner region 150 is provided at least substantially at (e.g., on or in) STI feature 112 walls. In certain embodiments of the present invention, the liner regions 150 may take the form of or include a nitride containing STI liner region 150. Liner 150 may, in certain embodiments of the present invention, be characterized as being about 0.5 nm to 10 nm angstrom thick, such as about 3 nm angstrom thick, for example.

In certain embodiments of the present invention, liner 150 may be formed by oxidizing one or more of the walls of the STI feature 112 to provide a corresponding $SiO_2$ region. Processing may include an $NH_3$ bake of such an $SiO_2$ region, to provide a nitrided liner. Alternatively, or in addition thereto, other processing techniques for providing a nitride-containing region 150, such as ones using a Decoupled Plasma Nitridation (DPN) technique, may be used to form such a nitrided liner region.

Figure 8:
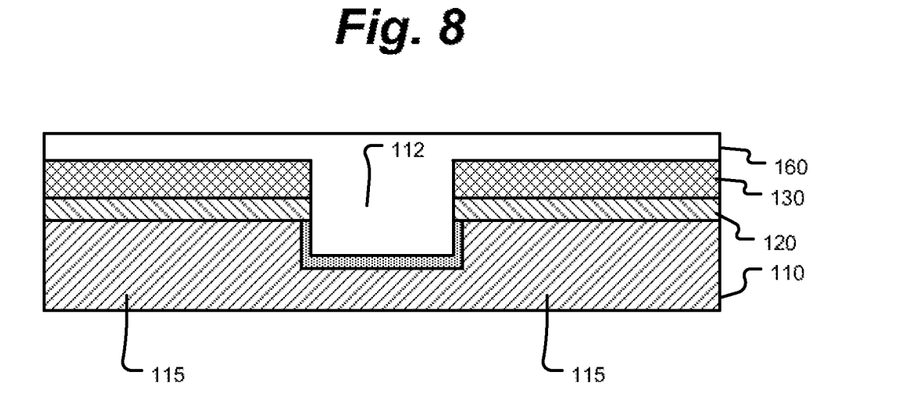

Referring now also to FIG. 8, there is shown an embodiment of a processed substrate 110 according to certain embodiments of the present invention. In the illustrated case, a dielectric layer 160 may be formed over the composite structure. Layer 160 may take the form of a Hf containing material, such as a HfSiON, layer that at least partially fills the nitride lined STI feature 112. Layer 160 may coat at least a portion of SiN pad 130, for example. Layer 160 may, in certain embodiments of the present invention, be characterized as being about 2,000-5,000 angstroms thick, such as about 3,000 angstroms thick for example.

Such a layer may be formed using any suitable processing for forming such a layer 160 on or over at least a portion of the patterned composite structure, and/or at least partially filling STI feature 112, such as Metal Organic Chemical Vapor Deposition (MOCVD) processing, for example.

Figure 9:
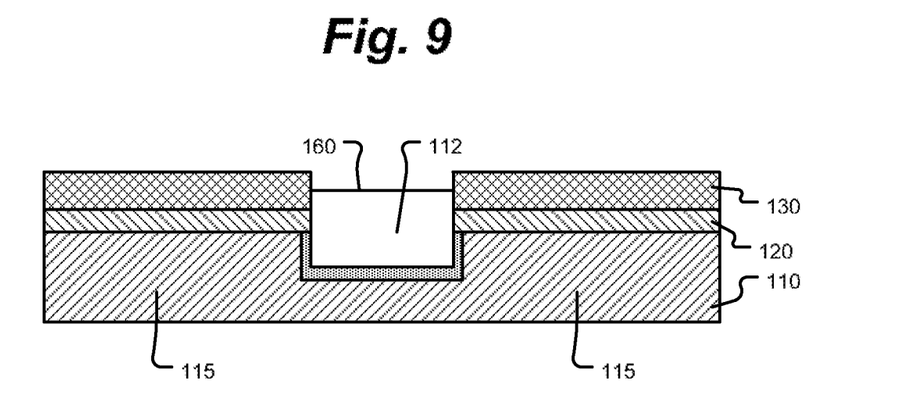

Referring now also to FIG. 9, there is shown an embodiment of a processed substrate 110 according to certain embodiments of the present invention. In the illustrated case, layer 160 may be thinned and/or at least substantially removed from the major face of the composite structure. Such processing may include, for example, a chemical mechanical processing (CMP) technique followed by a touch up process that can remove residuals from the pad nitride regions if present. The touch up process may consist of a dry or wet etching process that is capable of removing Hf based materials without appreciable etching SiN. One example of such etch is hydrofluoric acid for example.

In the illustrated case, a portion of layer 160 at least partially contained within STI feature 112 remains. In the illustrated case, the remaining portion of layer 160 is recessed within STI feature 112 relative to layer 130. Suitable processing to form such a recess may include, for example, touch-up-type processing, such as processing including a reactive ion etch (RIE) technique, for example.

Figure 10:
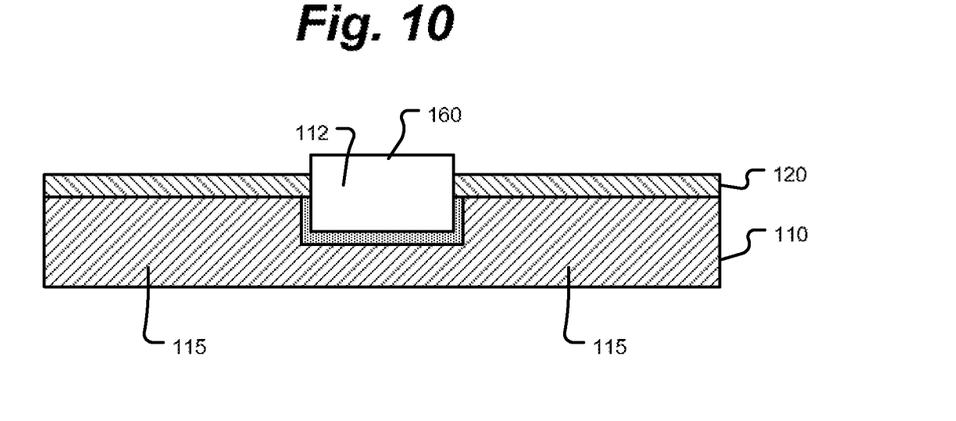

Referring now also to FIG. 10, there is shown an embodiment of a processed substrate 110 according to certain embodiments of the present invention. In the illustrated case, nitride pad 130 may be at least substantially removed from the major face of the composite structure.

Such processing may include, for example, an acid etching technique. Such processing may include conventional hot phosphoric acid processing to remove pad 130, for example.

As will be understood by those possessing an ordinary skill in the pertinent arts, layer 160 being positioned over nitride liner 150 may advantageously mitigate liner 150 otherwise being stripped with pad 130.

Figure 11:
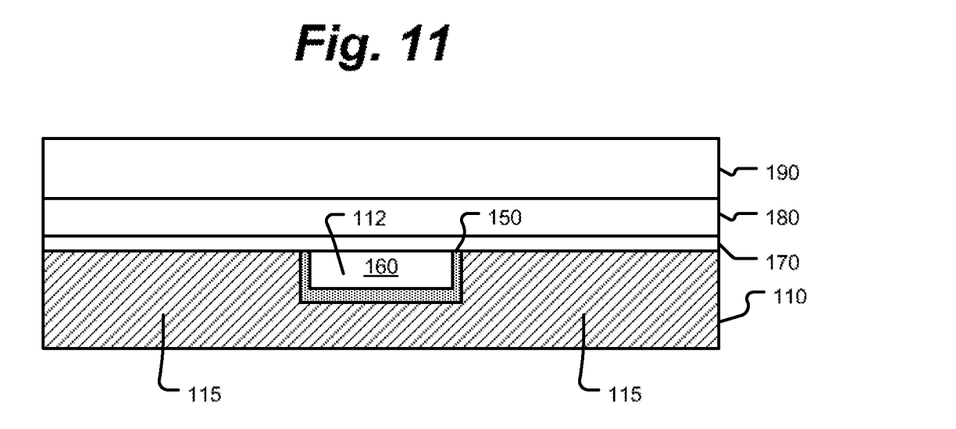

Referring now to FIG. 11, the composite structure may be used as a STI feature incorporating substrate for semiconductor-device formation using active regions 115. For example, conventional processing may be used to form gate first, metal gate, high k field effect transistors (FETs) gate stacks over one or more of active regions 115. In the illustrated case of FIG. 11, a $HfO_2$ gate dielectric layer 170, a metal layer 180 (alternatively with workfunction shifting material deposited but not shown) and a poly Si layer 190, each corresponding to gate stack, for example, are shown.

It should be understood that while not limited to any particular device configuration, such a STI feature incorporating substrate may be particularly useful where one or more of the device layers, such as the gate dielectric layer 170 straddles an incorporated STI feature for the purpose of strapping active regions together by a common gate as is commonly used in the case of SRAM cell layouts and other circuit constructions.

Figure 12:
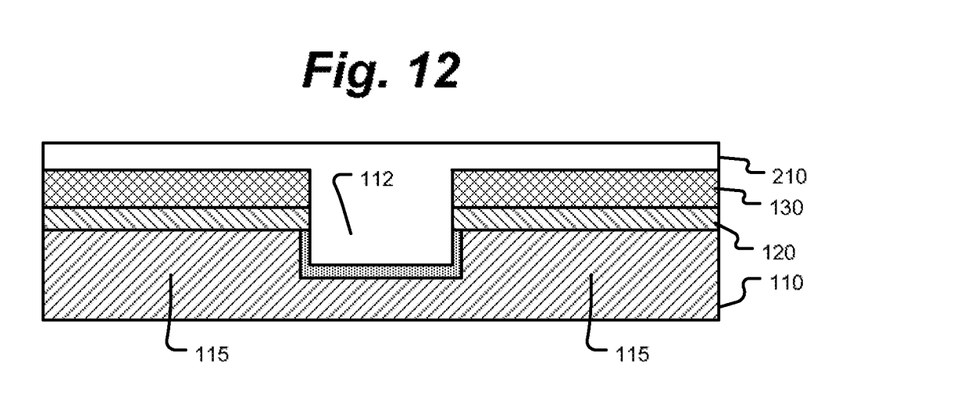

Referring now also to FIG. 12, there is shown an embodiment of a processed substrate 110 according to certain embodiments of the present invention. In the illustrated case, an oxide layer 210 may be formed over an STI feature 112 incorporating composite structure, such as that shown in FIG. 7. Layer 210 may take the form of a $SiO_2$ layer that at least partially fills the nitride lined STI feature and coats at least a portion of SiN pad 130, for example. Layer 210 may, in certain embodiments of the present invention, be about 20-200 nm thick, such as about 100 nm thick being preferred, for example.

Such a layer may be formed using processing that may, in certain embodiments of the present invention, be characterized as deposited by HDP high density plasma or SACVD sub atmospheric chemical vapor deposition.

Figure 13:
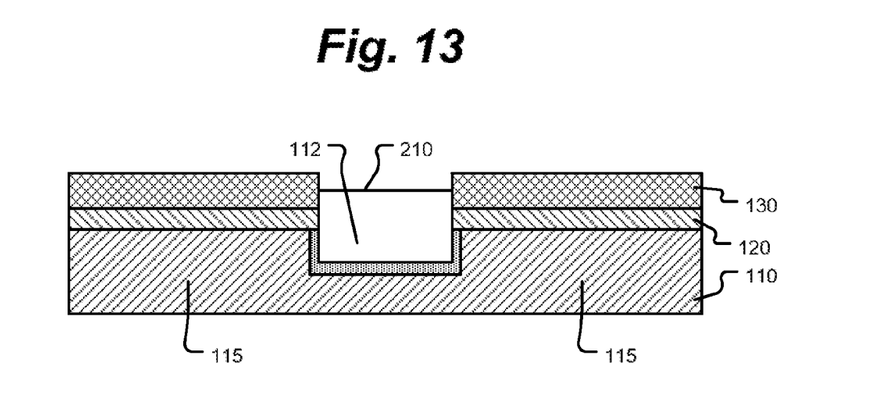

Referring now also to FIG. 13, there is shown an embodiment of a processed substrate 110 according to certain embodiments of the present invention. In the illustrated case, oxide layer 210 may be thinned and/or at least substantially removed from the major face of the composite structure.

Suitable thinning processing may include, for example, a chemical mechanical processing (CMP) technique and etching, for example. In certain embodiments of the present invention an acid based wet (e.g., HF) and/or dry etch technique may be used, e.g., to recess oxide layer 210 below the top of nitride pad 130. Ideally the film 210 is first planarized by using CMP chemical mechanical polishing and stopping on the top of the pad nitride. Layer 210 may, in certain embodiments of the present invention, be thinned or recessed to about $\frac{1}{4}^{th}$ of the original height of the Si trench depth by using a wet chemical etch like hydrofluoric acid for example or a dry etch as is known in the art of semiconductor processing that is capable of etching SiO2 while not substantially etching Si or SiN.

Figure 14:
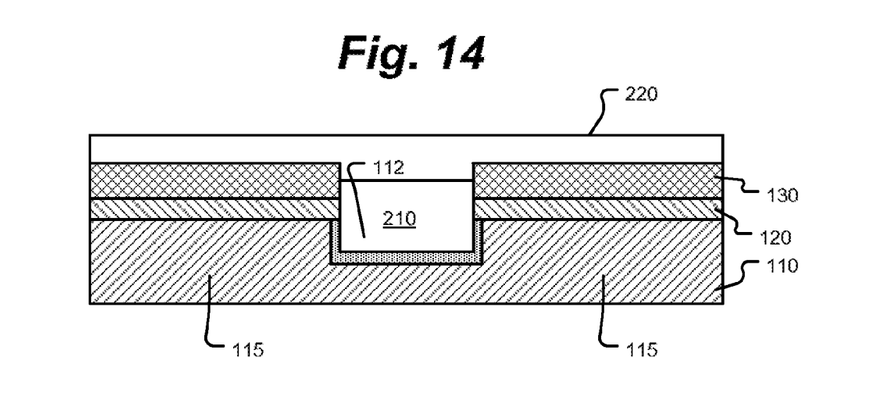

Referring now also to FIG. 14, there is shown an embodiment of a processed substrate 110 according to certain embodiments of the present invention. In the illustrated case, a dielectric layer 220 akin to layer 160 may be formed over the composite structure and/or at least partially within STI feature 112. Layer 220, may take the form of a HF containing STI trench fill, such as a HfSiON layer that at least partially fills the nitride lined STI feature 112 above oxide layer 210. Such a layer may coat at least a portion of SiN pad 130, for example. Layer 220 may, in certain embodiments of the present invention, be about 20-200 nm, and preferably about 100 nm thick, for example Processing use to form layer 220 may be akin to that used to form layer 160, for example. Ideally the layer 220 is planarized using a chemical mechanical polishing technique, possibly followed by a touch up technique to remove residuals from the pad nitride by wet etching like hydrofluoric acid or dry etching as is known in the art of semiconductor processing to etch Hf containing materials for example.

Figure 16:
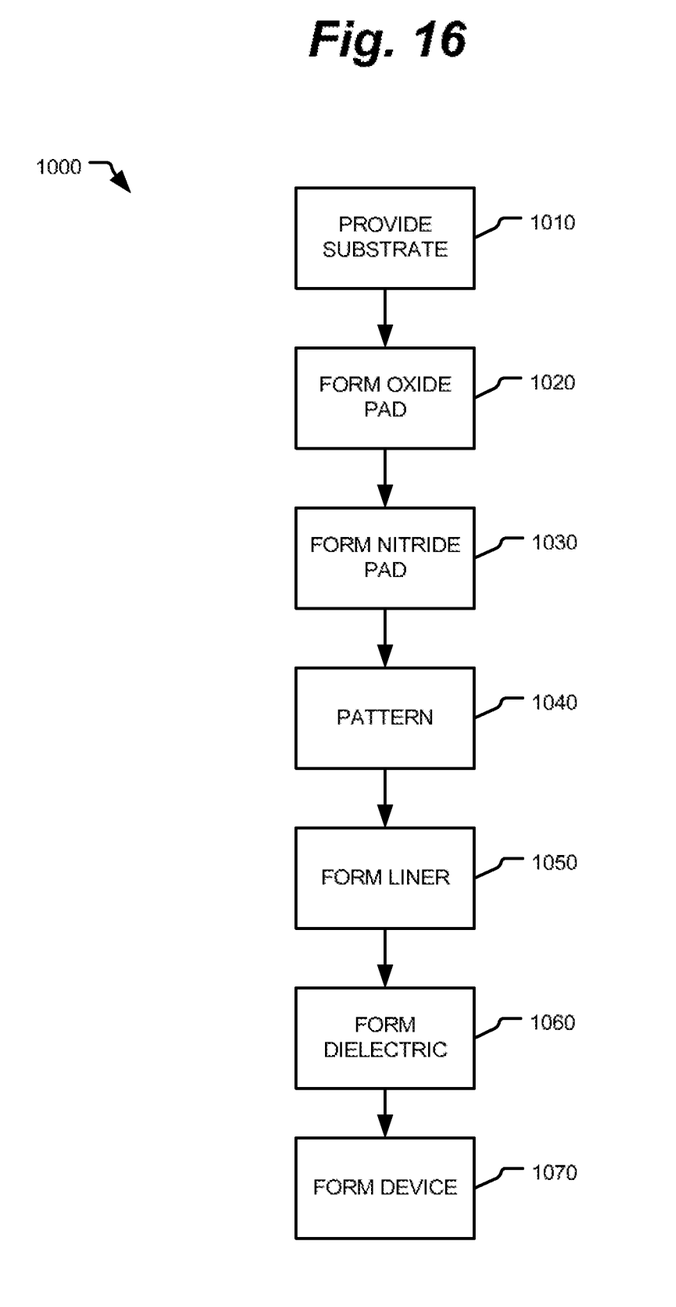
FIGS. 16 and 17 illustrate flow-diagrammatic views of processes.

Referring now to FIG. 16, there is shown a flow-diagrammatic view of a process 1000 according to certain embodiments of the present invention. Process 1000 includes providing a substrate at block 1010, such as that shown in and described with regard to FIG. 1, for example. Process 1000 includes forming an oxide pad at block 1020, such as that shown in and described with regard to FIG. 2, for example. Process 1000 includes forming a nitride pad at block 1030, such as that shown in and described with regard to FIG. 3, for example. Process 1000 includes patterning the substrate, oxide and nitride pads at block 1040, such as is shown in and described with regard to FIG. 4, for example. Process 1000 includes patterning the substrate, oxide and nitride pads at block 1040, such as is shown in and described with regard to FIGS. 4, 5 and 6, for example. Process 1000 includes forming a liner at block 1050, such as is shown in and described with regard to FIG. 7, for example. Process 1000 includes forming a dielectric at block 1060, such as is shown in and described with regard to FIGS. 8 and 9, for example. Process 1000 includes forming a semiconductor device, such as a FET, at block 1070, such as is shown in and described with regard to FIGS. 10-11, for example.

Figure 15:
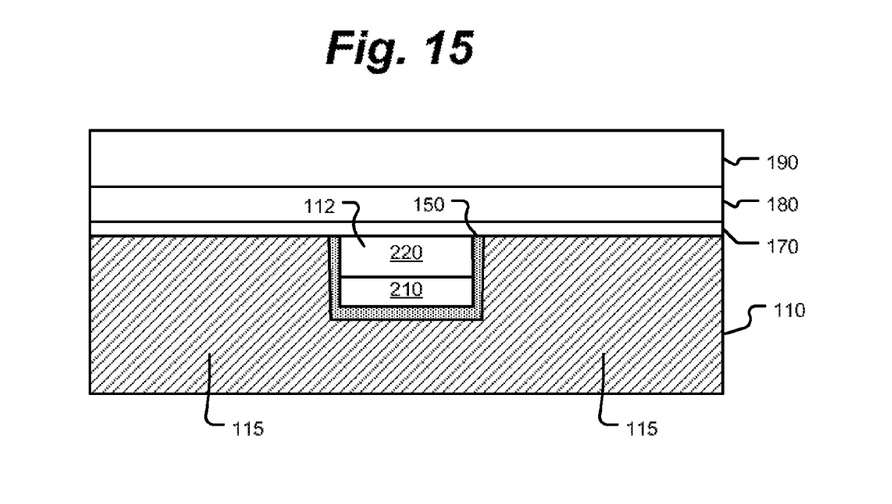
Figure 17:
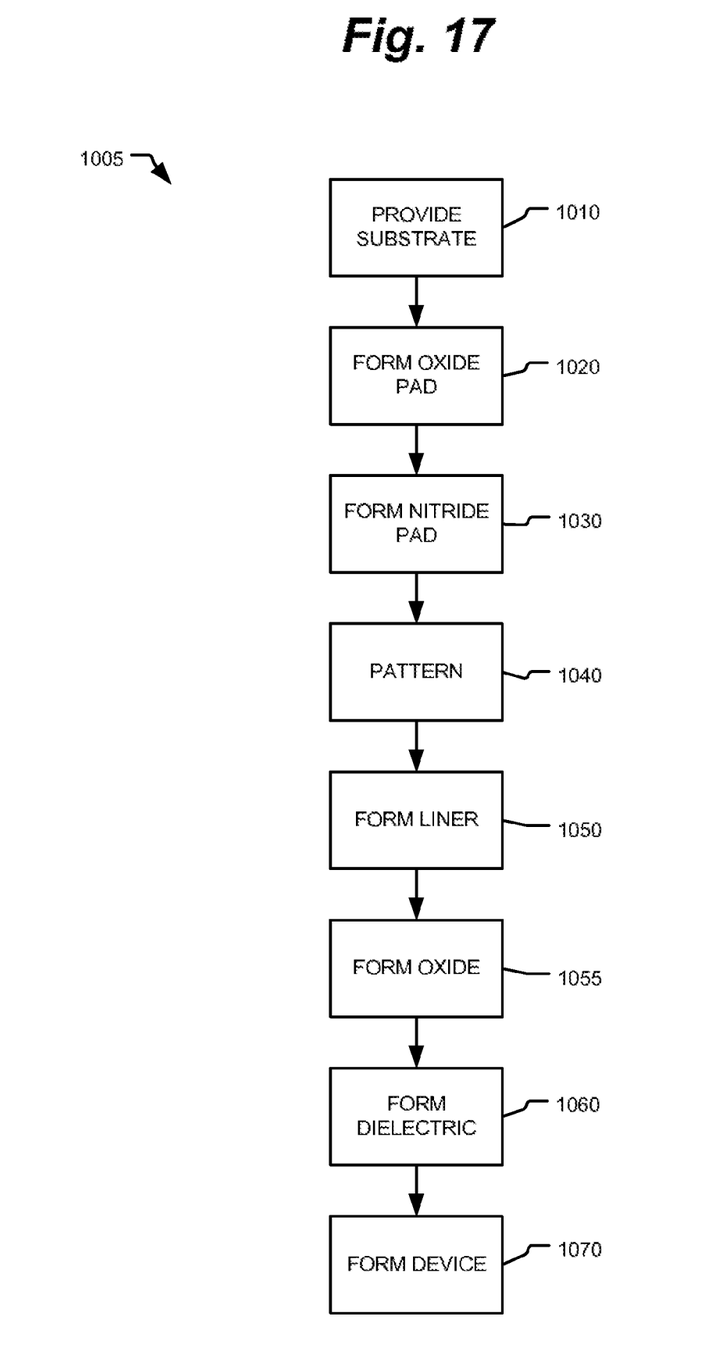

Referring now to FIG. 17, there is shown a flow-diagrammatic view of another process 1005 according to certain embodiments of the present invention. Process 1000 includes providing a substrate at block 1010, such as that shown in and described with regard to FIG. 1, for example. Process 1005 includes forming an oxide pad at block 1020, forming a nitride pad at block 1030, patterning the substrate, oxide and nitride pads at block 1040, and forming a liner at block 1050, analogously to process 1000 (FIG. 16). Process 1005 includes forming an oxide at block 1055, such as that shown in and discussed with regard to FIGS. 12 and 13, for example. Process 1005 includes forming a dielectric at block 1060, such as is shown in and described with regard to FIG. 14, for example. Process 1000 includes forming a semiconductor device, such as a FET, at block 1070, such as is shown in and described with regard to FIG. 15, for example.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for manufacturing a semiconductor device comprising: providing a substrate having at least one isolation cavity and at least one active area substantially adjacent to the isolation cavity; lining the isolation cavity with a nitride liner such that the nitride liner is in direct contact with the isolation cavity of the substrate; at least partially filling the lined cavity with a hafnium containing dielectric; and incorporating at least one bulk oxide interposed between at least a part of the hafnium containing dielectric fill and a part of the nitride liner, wherein the at least one bulk oxide is SiO2; and forming a gate stack over and at least partially aligned with at least a portion of the at least one active area and the halfnium containing dielectric fill, wherein the gate stack comprises a HfO2 gate dielectric layer and is disposed on top of and in contact with the hafnium containing dielectric fill.

2. The method of claim 1, wherein the substrate is an SOI substrate having an isolation cavity that extends into a buried insulator.

3. The method of claim 1, wherein the substrate comprises oxide and nitride pads.

4. The method of claim 1, wherein the providing a substrate having at least one isolation cavity comprises forming at least one shallow trench isolation feature.

5. The method of claim 3, wherein the providing a substrate having at least one isolation cavity comprises etching at least one shallow trench isolation feature into the substrate through the nitride and oxide pads.

6. The method of claim 1, wherein lining the isolation cavity comprises forming a nitride liner substantially around the isolation cavity in the substrate.

7. The method of claim 1, wherein lining the isolation cavity comprises exposing the cavity to $NH_3$.

8. The method of claim 1, wherein lining the isolation cavity comprises exposing the cavity to decoupled plasma nitridation.

9. The method of claim 1, wherein the hafnium containing dielectric is HfSiON.

10. The method of claim 1, wherein the gate stack further comprises a metal layer.

11. The method of claim 10, wherein the gate stack further comprises a poly Si layer.

12. The method of claim 1, wherein the $HfO_2$ gate dielectric layer straddles the isolation cavity and straps active regions together by a common gate.

13. A method for manufacturing a semiconductor device comprising: providing an SOI substrate having nitride and oxide pads, at least one isolation cavity, and at least one active area substantially adjacent to the isolation cavity; lining the isolation cavity with a nitride liner such that the nitride liner is in direct contact with the isolation cavity of the substrate; at least partially filling the lined cavity with HfSiON incorporating $SiO_2$ between at least a part of the HfSiON dielectric fill and a part of the nitride liner; and forming a gate stack over and at least partially aligned with at least a portion of the at least one active area and the HfSiON dielectric fill, wherein the gate stack comprises a HfO2 gate dielectric layer that is in contact with the HfSiON dielectric fill.

14. The method of claim 13, wherein the gate stack further comprises a metal layer.

15. The method of claim 13, wherein the gate stack further comprises a poly Si layer.

16. The method of claim 13, wherein the $HfO_2$ gate dielectric layer straddles the isolation cavity and straps active regions together by a common gate.

* * * * *